United States Patent
Zhang et al.

(10) Patent No.: US 10,209,584 B2
(45) Date of Patent: Feb. 19, 2019

(54) MANUFACTURING METHOD OF METAL LAYER, FUNCTIONAL SUBSTRATE AND MANUFACTURING METHOD THEREOF, AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Xiaoxiang Zhang, Beijing (CN); Liping Luo, Beijing (CN); Mingxuan Liu, Beijing (CN); Huibin Guo, Beijing (CN); Zhichao Zhang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/541,580

(22) PCT Filed: Jan. 3, 2017

(86) PCT No.: PCT/CN2017/000062
§ 371 (c)(1),
(2) Date: Jul. 5, 2017

(87) PCT Pub. No.: WO2017/177725
PCT Pub. Date: Oct. 19, 2017

(65) Prior Publication Data
US 2018/0203281 A1    Jul. 19, 2018

(30) Foreign Application Priority Data
Apr. 11, 2016    (CN) .......................... 2016 1 0221405

(51) Int. Cl.
*H01L 21/3205*    (2006.01)
*G02F 1/1343*    (2006.01)
(Continued)

(52) U.S. Cl.
CPC ......... *G02F 1/13439* (2013.01); *G02B 5/201* (2013.01); *G02F 1/1362* (2013.01);
(Continued)

(58) Field of Classification Search
CPC ......... H01L 21/76813; H01L 21/76877; H01L 21/76804; H01L 23/53295
See application file for complete search history.

(56) References Cited

U.S. PATENT DOCUMENTS

2005/0270450 A1    12/2005    Ahn et al.
2006/0007530 A1    1/2006    Otake et al.
(Continued)

FOREIGN PATENT DOCUMENTS

CN    1392443 A    1/2003
CN    1707338 A    12/2005
(Continued)

OTHER PUBLICATIONS

The First Chinese Office Action dated Dec. 11, 2017; Appln. No. 201610221405.7.
(Continued)

*Primary Examiner* — Thomas L Dickey
(74) *Attorney, Agent, or Firm* — Ladas & Parry LLP

(57) ABSTRACT

A manufacturing method of a metal layer, a functional substrate and a manufacturing method thereof, and a display device are provided. The manufacturing method of a metal layer includes: forming an insulating layer on a base substrate; forming an etching buffer layer on the insulating layer; patterning the etching buffer layer and the insulating layer to form a plurality of recessed microstructures in the
(Continued)

insulating layer; stripping the etching buffer layer; and forming a metal layer on the insulating layer, a surface of the metal layer adjacent to the insulating layer is formed with a plurality of protruded portions which are filled into the plurality of recessed microstructures. The manufacturing method of a metal layer may form a metal layer with anti-reflection effect.

20 Claims, 6 Drawing Sheets

(51) Int. Cl.
  *H01L 27/12* (2006.01)
  *G02B 5/20* (2006.01)
  *G02F 1/1335* (2006.01)
  *G02F 1/1362* (2006.01)
  *H01L 27/32* (2006.01)
  *H01L 51/52* (2006.01)
  *G02F 1/1333* (2006.01)
  *H01L 51/00* (2006.01)

(52) U.S. Cl.
  CPC .. *G02F 1/133345* (2013.01); *G02F 1/133502* (2013.01); *G02F 1/133514* (2013.01); *G02F 1/133553* (2013.01); *G02F 1/136286* (2013.01); *H01L 27/12* (2013.01); *H01L 27/3244* (2013.01); *H01L 51/0096* (2013.01); *H01L 51/5268* (2013.01); *H01L 51/5284* (2013.01); *G02F 2001/136295* (2013.01); *G02F 2201/38* (2013.01)

(56) References Cited

U.S. PATENT DOCUMENTS

| | | |
|---|---|---|
| 2007/0284586 A1 | 12/2007 | Park et al. |
| 2007/0290229 A1 | 12/2007 | Choi et al. |
| 2011/0212616 A1* | 9/2011 | Seidel ............... H01L 21/31144 438/652 |
| 2015/0214253 A1 | 7/2015 | Xu et al. |
| 2016/0306241 A1 | 10/2016 | Choi |
| 2017/0104033 A1 | 4/2017 | Su et al. |

FOREIGN PATENT DOCUMENTS

| | | |
|---|---|---|
| CN | 1815321 A | 8/2006 |
| CN | 101079429 A | 11/2007 |
| CN | 101082721 A | 12/2007 |
| CN | 101093325 A | 12/2007 |
| CN | 101477989 A | 7/2009 |
| CN | 101556414 A | 10/2009 |
| CN | 102339772 A | 2/2012 |
| CN | 103325792 A | 9/2013 |
| CN | 104181741 A | 12/2014 |
| CN | 104536194 A | 4/2015 |
| CN | 105355589 A | 2/2016 |
| CN | 105826249 A | 8/2016 |

OTHER PUBLICATIONS

International Search Report and Written Opinion dated Mar. 31, 2017; PCT/CN2017/000062.
The Second Chinese Office Action dated Sep. 3, 2018; Appln. No. 201610221405.7.

* cited by examiner

MANUFACTURING METHOD OF METAL LAYER, FUNCTIONAL SUBSTRATE AND MANUFACTURING METHOD THEREOF, AND DISPLAY DEVICE

TECHNICAL FIELD

Embodiments of the present disclosure relate to a manufacturing method of a metal layer, a functional substrate and a manufacturing method thereof, and a display device.

BACKGROUND

A metal electrode and a metal wire are widely used in a liquid crystal display (LCD) as well as an organic light emitting display (OLED) and other display devices. For example, in a usual liquid crystal display apparatus, an array substrate includes a gate electrode, a gate line, a source electrode, a drain electrode or a data line etc. which are made of metal. Furthermore, in a display apparatus with touch function usually includes a touch electrode etc. made of metal.

Furthermore, in the field of display apparatus, a metal electrode and a metal wire are usually formed by forming a metal layer on a base substrate firstly, and then utilizing a patterning process to pattern the metal layer. Since the metal layer has a relatively strong light reflecting ability, the metal electrode and the metal wire have a stronger light reflecting ability.

SUMMARY

At least one embodiment of the present disclosure provides a manufacturing method of a metal layer, a functional substrate and a manufacturing method thereof, and a display device. The manufacturing method of a metal layer forms an insulating layer below a metal layer, and forms a plurality of recessed microstructures in the insulating layer, such that a surface of the metal layer adjacent to the insulating layer is formed with a plurality of protruded portions which are filled into the plurality of recessed microstructures, so as to form a rough surface. The surface of the metal layer adjacent to the insulating layer is capable of reflecting light irradiated to the surface in different directions, so as to solve mirror reflection problem of the metal layer.

At least one embodiment of the present disclosure provides a manufacturing method of a metal layer, which includes: forming an insulating layer on a base substrate; forming an etching buffer layer on the insulating layer; patterning the etching buffer layer and the insulating layer to form a plurality of recessed microstructures in the insulating layer; stripping the etching buffer layer; and forming a metal layer on the insulating layer, a surface of the metal layer adjacent to the insulating layer is formed with a plurality of protruded portions which are filled into the plurality of recessed microstructures.

For example, in the manufacturing method of a metal layer provided by an embodiment of present disclosure, which includes: forming photoresist on the etching buffer layer; utilizing a mask plate to expose the photoresist and developing the photoresist to form a photoresist pattern; and etching the etching buffer layer and the insulating layer with the photoresist pattern as a mask, so as to pattern the etching buffer layer and the insulating layer to form the plurality of recessed microstructures in the insulating layer.

For example, in the manufacturing method of a metal layer provided by an embodiment of present disclosure, in a process of etching the etching buffer layer and the insulating layer with the photoresist pattern as a mask, an etching rate of the etching buffer layer is greater than or equal to an etching rate of the insulating layer.

For example, in the manufacturing method of a metal layer provided by an embodiment of present disclosure, the plurality of recessed microstructures include micropores or microgrooves.

For example, in the manufacturing method of a metal layer provided by an embodiment of present disclosure, the micropores include inverted conical holes, inverted frustum holes or inverted hemispherical holes.

For example, in the manufacturing method of a metal layer provided by an embodiment of present disclosure, the plurality of recessed microstructures are arranged in a regular arrangement.

For example, in the manufacturing method of a metal layer provided by an embodiment of present disclosure, the etching buffer layer includes deep ultraviolet light-absorbing oxide.

For example, in the manufacturing method of a metal layer provided by an embodiment of present disclosure, the insulating layer has a thickness of 500-1500 Å.

For example, in the manufacturing method of a metal layer provided by an embodiment of present disclosure, the plurality of recessed microstructures penetrate through or do not penetrate through the insulating layer.

At least one embodiment of the present disclosure provides a manufacturing of a functional substrate, which includes forming a metal layer on a base substrate; and patterning the metal layer to form a conductive structure, the metal layer is formed according to any one of the manufacturing method of a metal layer as mentioned above.

For example, in the manufacturing method of a functional substrate provided by an embodiment of the present disclosure, the conductive structure includes a gate line, a gate electrode, a data line, a source electrode, a drain electrode or a touch electrode.

At least one embodiment of the present disclosure provides a functional substrate, which includes a base substrate, an insulating layer disposed on the base substrate and a conductive structure disposed on the insulating layer, the conductive structure includes a metal layer, the insulating layer is provided with a plurality of recessed microstructures, a surface of the metal layer adjacent to the insulating layer is formed with a plurality of protruded portions which are filled into the plurality of recessed microstructures.

For example, in the functional substrate provided by an embodiment of the present disclosure, the plurality of recessed microstructures include micropores or microgrooves.

For example, in the functional substrate provided by an embodiment of the present disclosure, the micropores include inverted conical holes, inverted frustum holes or inverted hemispherical holes.

For example, in the functional substrate provided by an embodiment of the present disclosure, the plurality of recessed microstructures are arranged in a regular arrangement.

For example, in the functional substrate provided by an embodiment of the present disclosure, the etching buffer layer includes deep ultraviolet light-absorbing oxide.

For example, in the functional substrate provided by an embodiment of the present disclosure, the insulating layer has a thickness of 500-1500 Å.

For example, in the functional substrate provided by an embodiment of the present disclosure, the plurality of recessed microstructures penetrate through or do not penetrate through the insulating layer.

For example, in the functional substrate provided by an embodiment of the present disclosure, the conductive structure includes a gate line, a gate electrode, a data line, a source electrode, a drain electrode or a touch electrode.

At least one embodiment of the present disclosure provides a display device, comprising any one of the functional substrate as mentioned above.

For example, the display device provided by an embodiment of the present disclosure, further includes a color filter substrate and a liquid crystal layer, wherein, the liquid crystal layer is disposed between the functional substrate and the color filter substrate, a surface of the functional substrate facing away from the liquid crystal layer is a light exit surface of the display device.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention, not limitative to the present disclosure.

DRAWING REFERENCES

Figure 1:
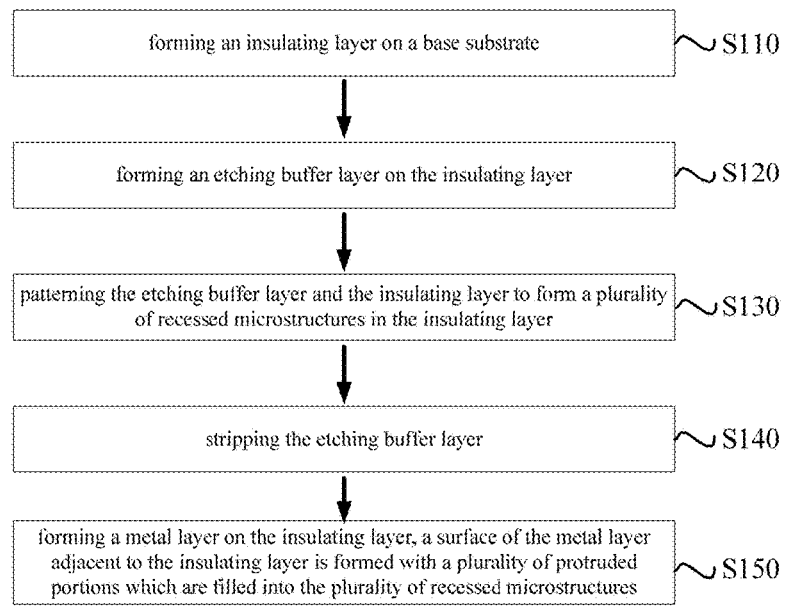
FIG. 1 is a flow diagram of a manufacturing method of a metal layer provided by an embodiment of the present disclosure.

100—functional substrate; 101—base substrate; 102—insulating layer; 1020—microstructure; 1021—micropore; 1022—microgroove; 1023—bent microgroove; 103—etching buffer layer; 104—metal layer; 1040—protruded portion; 105—photoresist; 106—photoresist pattern; 107—conductive structure; 1071—gate line; 1072—gate electrode; 1073—data line; 1074—source electrode; 1075—drain electrode; 1076—touch electrode; 108—mask plate; 111—gate insulating layer; 112—another insulating layer; 113—planarization layer; 114—pixel electrode; 115—active layer pattern; 116—through hole; 150—light exit surface; 200—color filter substrate; 300—liquid crystal layer.

DETAILED DESCRIPTION

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the disclosure. Based on the described embodiments herein, one person skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present invention belongs. The terms "first," "second," and so on which are used in the description and the claims of the present application for invention, are not intended to indicate any sequence, amount or importance, but distinguish various components. The terms "includes," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly.

With the continuous pursuit of people for display quality of display devices, how to further improve the display quality has become the focus of manufacturers and markets. In a usual liquid crystal display, for example, in a liquid crystal display, an array substrate includes a gate electrode, a gate line, a source electrode, a drain electrode or a data line etc. which are made of metal. Those metal electrode and metal wire have a relatively strong light reflecting ability, in a case where light is illuminated on those metal electrodes and metal wires, mirror reflection is generated, which affects the display quality. After research, the inventor(s) of the present application considers that a surface of gate electrode, gate line, source electrode, drain electrode or data line can be formed as a rough surface, so as to solve the problem of light reflection as mentioned above and improve the display quality. However, the gate electrode, gate line, source electrode, drain electrode or data line is usually formed directly on a fragile array substrate and have a relatively small size, and a usual surface roughening process is difficult to play a role.

At least one embodiment of the present disclosure provides a manufacturing method of a metal layer, a functional substrate and a manufacturing method thereof, and a display device. The manufacturing method of a metal layer includes: forming an insulating layer on a base substrate; forming an etching buffer layer on the insulating layer; patterning the etching buffer layer and the insulating layer to form a plurality of recessed microstructures in the insulating layer; stripping the etching buffer layer; and forming a metal layer on the insulating layer, a surface of the metal layer adjacent to the insulating layer is formed with a plurality of protruded portions which are filled into the plurality of recessed microstructures. Since the surface of the metal layer adjacent to the insulating layer is formed with a plurality of protruded portions which are filled into the microstructures, the surface is capable of reflecting the light irradiated to the surface in different directions and solving mirror reflection problem of the metal layer.

Hereafter, the manufacturing method of a metal layer, the functional substrate and the manufacturing method thereof, and the display device provided in an embodiment of the present disclosure will be described below with reference to the drawings.

First Embodiment

The embodiment provides a manufacturing method of a metal layer, as illustrated in FIG. 1, the method includes the following steps 110-150.

Figure 2:
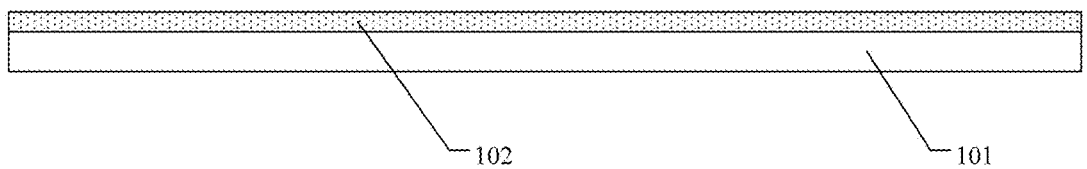
FIG. 2 is a schematic diagram of forming an insulating layer on a base substrate provided by an embodiment of the present disclosure.

Step 110: as illustrated in FIG. 2, providing a base substrate 101 and forming an insulating layer 102 on the base substrate 101.

For example, the base substrate 101 may be a glass substrate, a quartz substrate, a resin substrate or other substrates; the material of the insulating layer 102 may be silicon nitride (SiNx), silicon oxide (SiOX), silicon oxynitride (SiNxOy) or other insulating materials.

Figure 3:
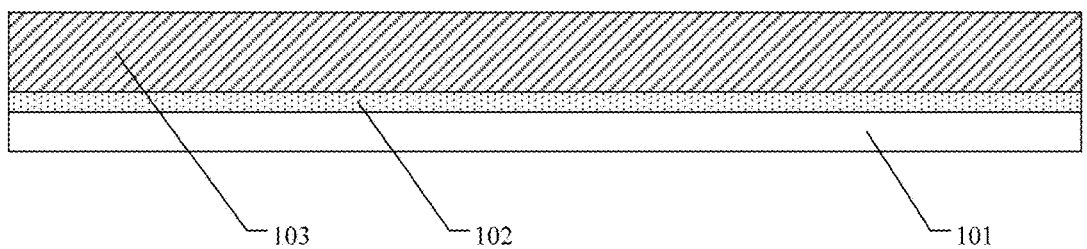
FIG. 3 is a schematic diagram of forming an etching buffer layer on an insulating layer provided by an embodiment of the present disclosure.

Step 120: as illustrated in FIG. 3, forming an etching buffer layer 103 on the insulating layer 102.

For example, the etching buffer layer 103 may include deep ultraviolet light-absorbing oxide (DUO), for example, the etching buffer layer 103 may include organic siloxane polymer.

Step 130: patterning the etching buffer layer 103 and the insulating layer 102 to form a plurality of recessed microstructures 1020 in the insulating layer 102.

Figure 4A:
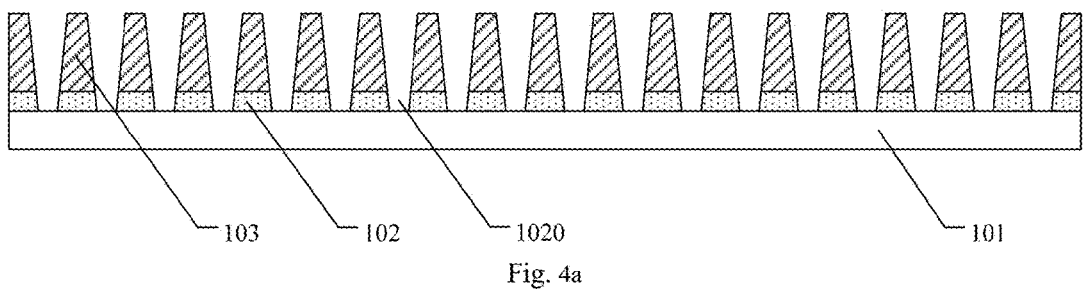
FIGS. 4a-4b are schematic diagrams of patterning an etching buffer layer and an insulating layer provided by an embodiment of the present disclosure.
Figure 4B:
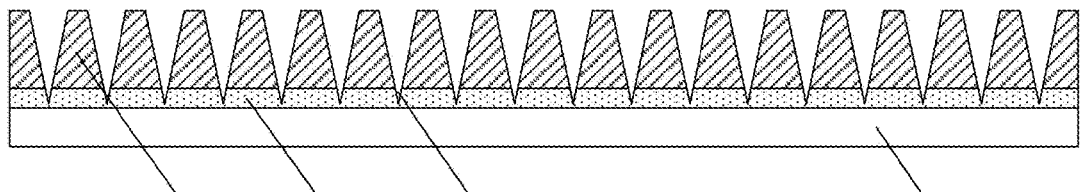

For example, as illustrated in FIG. 4a, the plurality of recessed microstructures penetrate through the insulating layer 102; or as illustrated in FIG. 4b, the insulating layer 102 is not penetrated through, and the plurality of recessed microstructures 1020 are formed on an upper part of the insulating layer 102.

Figure 5:
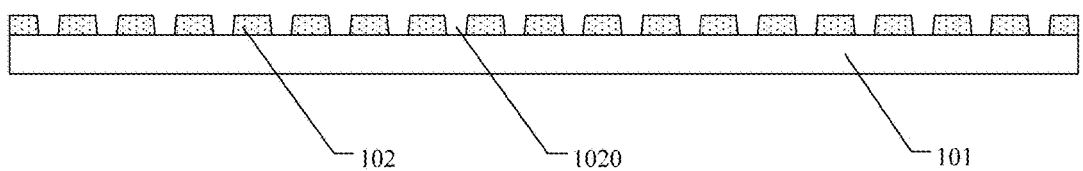
FIG. 5 is a schematic diagram of stripping an etching buffer layer provided by an embodiment of the present disclosure.

Step 140: as illustrated in FIG. 5, stripping the etching buffer layer 103.

Figure 6:
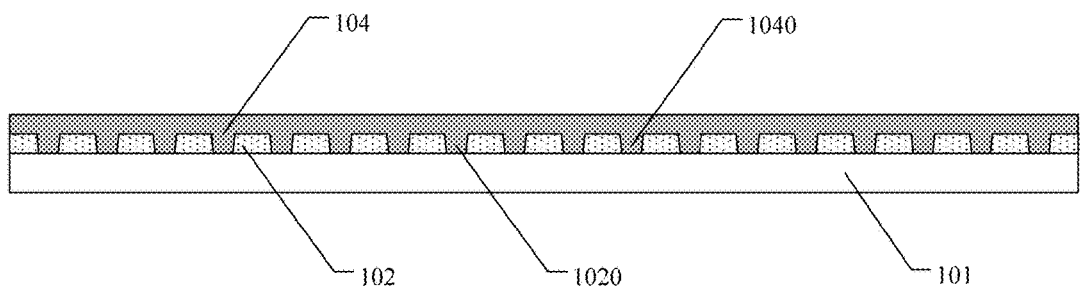
FIG. 6 is a schematic diagram of forming a metal layer on an insulating layer provided by an embodiment of the present disclosure.

Step 150: as illustrated in FIG. 6, forming a metal layer 104 on the insulating layer 102, a surface of the metal layer 104 adjacent to the insulating layer 102 is formed with a plurality of protruded portions 1040 which are filled into the plurality of recessed microstructures 1020.

It should be noted that, the "adjacent" in the present embodiment refers to "close" or "near"; the "recessed microstructures 1020" refer to a removed portion of the insulating layer 120 during the patterning process in the step 130; furthermore, the protruded portions 140 fit in with the shape of the recessed microstructures 1020.

For example, the metal layer 104 may be a single layer of any one or a stacked layer of more selected from a group consisting of chromium, molybdenum, aluminum, copper, aluminum alloy, copper alloy, and the like.

In the manufacturing method of a metal layer provided by the present embodiment, etching the insulating layer 102 by etching agent to form the plurality of recessed microstructures 1020, and then forming the metal layer 104 on the insulating layer 102, such that the surface of the metal layer 104 formed on the insulating layer 102 which is adjacent to the insulating layer 102 is formed with the plurality of protruded portions 1040 which are filled into the plurality of recessed microstructures 1020; that is to say, the surface of the metal layer 104 adjacent to the insulating layer 102 is a rough surface; in a case where light is illuminated on the surface of the metal layer 104 adjacent to the insulating layer 102, the light is reflected in all directions to avoid experiencing an overall mirror reflection; thus, the surface of the metal layer 104 adjacent to the insulating layer 102 is capable of playing an anti-reflective role. Furthermore, in a display field, an etching accuracy of an etching process is generally about 2 μm, in order to form the plurality of recessed microstructures 1020 with a smaller size, as illustrated in FIG. 4a to FIG. 4b, the etching buffer layer 103 formed on the insulating layer 102 is capable of making an etched channel forming in the etching buffer layer 103 and the insulating layer 102 have a "V" shape or an inverted trapezoid shape through controlling dose of the etching agent or etching time, such that the size of plurality of recessed microstructures 1020 formed in the insulating layer 102 is less than 2 μm. It should be noted that, the etched channel as mentioned above refers to a remained through hole in the direction perpendicular to the base substrate 101 after the etching agent etching the etching buffer layer 103 and the insulating layer 102.

For example, in the manufacturing method of a metal layer provided by an example of the present embodiment, the step 130 of patterning the etching buffer layer 103 and the insulating layer 102 so as to form the plurality of recessed microstructures on the insulating layer 102 includes the following specific steps 131-133.

Figure 7A:
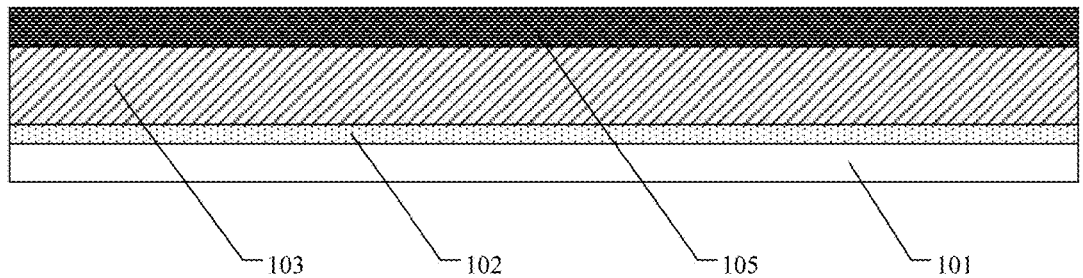
FIGS. 7a-7c are schematic diagrams of technological process of patterning an etching buffer layer and an insulating layer provided by an embodiment of the present disclosure.

Step 131: as illustrated in FIG. 7a, forming photoresist 105 on the etching buffer layer 103.

Figure 7B:
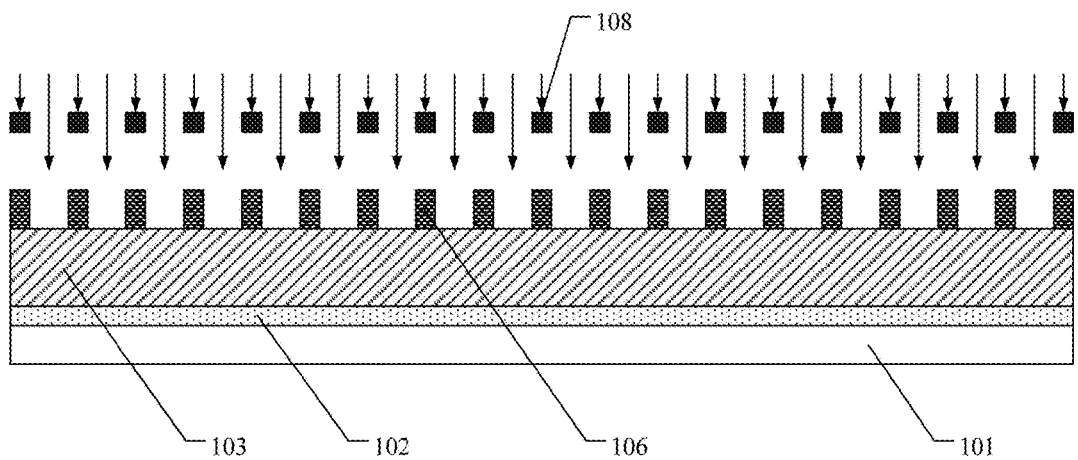

Step 132: as illustrated in FIG. 7b, utilizing a mask plate 108 to expose the photoresist and developing the photoresist to form a photoresist pattern 106.

Figure 7C:
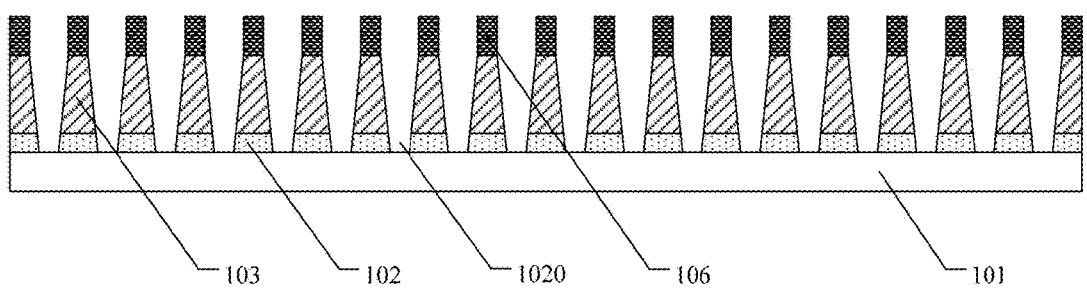

Step 133: as illustrated in FIG. 7c, etching the etching buffer layer 103 and the insulating layer 102 with the photoresist pattern 106 as a mask, so as to pattern the etching buffer layer 103 and the insulating layer 102 to form the plurality of recessed microstructures 1020 in the insulating layer 102.

For example, in the manufacturing method of a metal layer provided by an example of the present embodiment, in a process of etching the etching buffer layer 103 and the insulating layer 102 with the photoresist pattern 106 as a mask, an etching rate of the etching buffer layer 103 is greater than or equal to an etching rate of the insulating layer 102. That is to say, in a case that using the same etching agent to etch the etching buffer layer 103 and the insulating layer 102 simultaneously, the etching rate of the etching buffer layer 103 relative to the etching agent is set to be greater than or equal to the etching rate of the insulating layer 102 relative to the etching agent. Thus, after the etching buffer layer 103 is etched by the etching agent, the size of the etched channel formed in etching the insulating layer 102 by the etching agent is not increased, so as to make the size of the plurality of recessed microstructure 1020 formed in the insulating layer 102 smaller. Furthermore, in a case where the etching rate of the etching buffer layer 103 is equal to the etching rate of the insulating layer 102, the etched channel formed in the etching buffer layer 103 and the insulating layer 102 has a regular "V" shape or a regular inverted trapezoid shape, which is advantageous to control the size of the plurality of recessed microstructures 1020 formed in the insulating layer 102. It should be noted that, the etching rate of the etching buffer layer 103 is greater than or equal to the etching rate of the insulating layer 102, which may be achieved by selecting materials with different etching rates for the same etching agent, or achieved by selecting etching agent with different etching rates for materials of the etching buffer layer 103 and the insulating layer 102. Certainly, the etching rate of the etching buffer layer 103 may also be set to be less than the etching rate of the insulating layer 102, and the embodiments of the present disclosure are not limited herein. Furthermore, the "equal" as mentioned above is not limited to exactly equal, which may further include a case where a difference between the etching rate of the etching buffer layer 103 and the etching rate of the insulating layer 102 is within 5% of the etching rate of the etching buffer layer 103.

For example, in the manufacturing method of a metal layer provided by an example of the present embodiment, the plurality of recessed microstructures may include micropores 1021 or microgrooves 1022, which correspondingly make the protruded portions 1040 filled into the plurality of recessed microstructures 1020 include slight protrusions or protruded strips, so as to reflect collimated light irradiated to the protrusions or protruded strips in different directions.

Figure 8A:
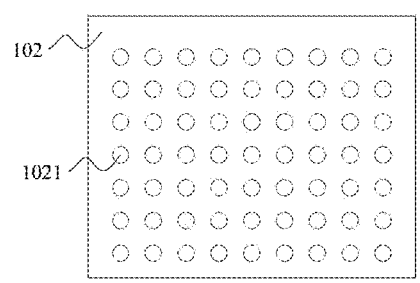
FIGS. 8a-8d are planar schematic diagrams of an insulating layer and a plurality of recessed microstructures in the insulating layer provided by an embodiment of the present disclosure.
Figure 8B:
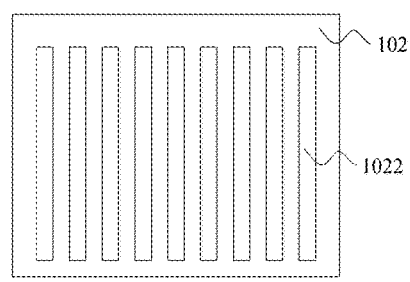
Figure 8C:
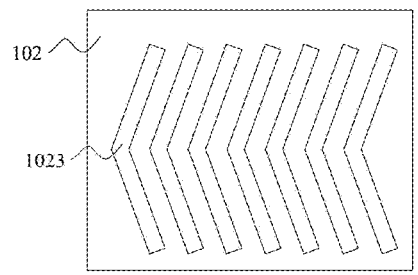
Figure 8D:
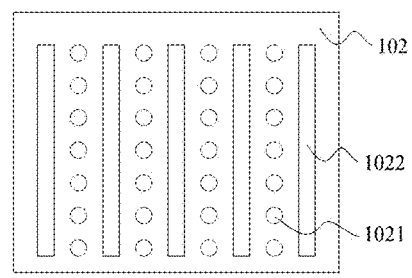

For example, FIG. 8a to 8d are planar schematic diagrams of the insulating layer 102 and the plurality of recessed microstructures 1020 formed in the insulating layer 102, as illustrated in FIG. 8a, the plurality of recessed microstructures 1020 in the insulating layer 102 include micropores 1021; as illustrated in FIG. 8b, the plurality of recessed microstructures 1020 in the insulating layer 102 include microgrooves 1022. In order to reflect the light irradiated on the protruded portions 1040 in more different directions, the plurality of recessed microstructures 1020 in the insulating layer 102 can be disposed to have a more complex structure; for example, as illustrated in FIG. 8c, the plurality of recessed microstructures 1020 in the insulating layer 102 may include bent microgrooves 1023; as illustrated in FIG. 8d, the plurality of recessed microstructures 1020 in the insulating layer 102 may include a combination of the micropores 1021 and the microgrooves 1022. Nevertheless, embodiments of the present disclosure are not limited to the cases as mentioned above.

For example, the micropores 1021 as mentioned above may include inverted conical holes, inverted frustum holes or inverted hemispherical holes etc. Correspondingly, the protruded portions 1021 filled into the micropores 1021 as mentioned above may include cones, frustums or hemispheres etc.

For example, in the manufacturing method of a metal layer provided by an example of the present embodiment, the plurality of the recessed microstructures are arranged in regular arrangement. It should be noted that, the regular arrangement as mentioned above refers to the plurality of recessed microstructures 1020 are arranged in a certain manner or arranged in a certain pattern period.

For example, in the manufacturing method of a metal layer provided by an example of the present embodiment, the insulating layer 102 may have a thickness of 500-1500 Å. It should be noted that, in a case where the insulating layer has a thinner thickness, if the microstructures in the insulating layer are etched directly, since the dose of the etching agent relative to the thinner insulating layer in the etching process is difficult to control, the formed microstructures are not suitable for the metal electrode or the wire with a small size. Therefore, in a case where the insulating layer has a thinner thickness, the etching buffer layer may further be capable of playing a role in the consumption of the excessive etching agent, such that a small amount of the etching agent may reach the insulating layer, and tiny microstructures are formed.

Second Embodiment

The present embodiment provides a manufacturing method of a functional substrate, which includes the following steps 210-220.

Figure 9:
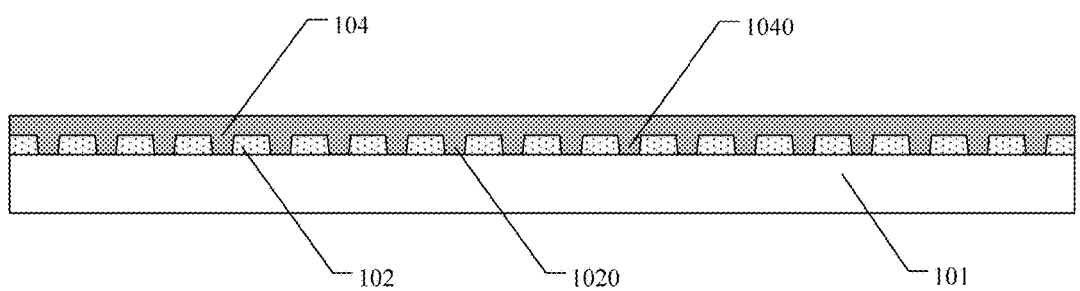
FIG. 9 is a schematic diagram of forming a metal layer on a base substrate in the insulating layer provided by an embodiment of the present disclosure.

Step 210: as illustrated in FIG. 9, forming a metal layer 104 on a base substrate 101 according to any one of the manufacturing method of a metal layer provided by the first embodiment as mentioned above.

For example, the base substrate 101 may be a glass substrate, a quartz substrate, a resin substrate, or other substrates; the metal layer 104 is a single layer of any one or a stacked layer of more selected from a group consisting of chromium, molybdenum, aluminum, copper, aluminum alloy, copper alloy, and the like.

Figure 10:
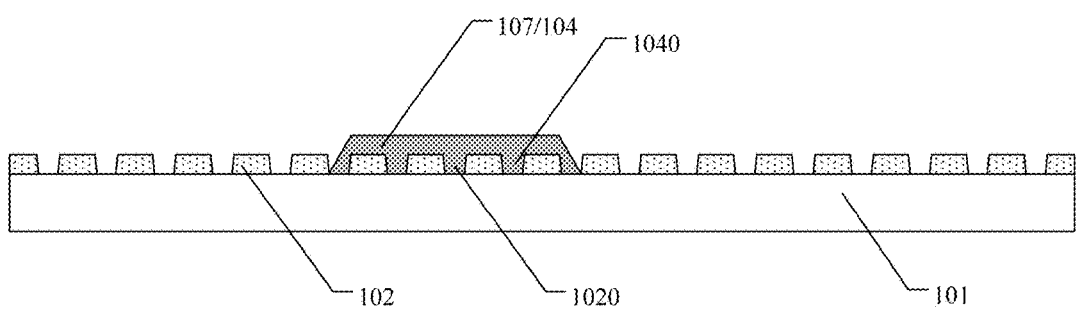
FIG. 10 is a schematic diagram of a functional substrate provided by an embodiment of the present disclosure.

Step 220: as illustrated in FIG. 10, patterning the metal layer 104 to form a conductive structure 107.

For example, the patterning process as mentioned above may include steps for coating photoresist, exposing, developing, etching, and stripping the photoresist.

In the manufacturing method of a functional substrate provided by the present embodiment, since applying the manufacturing method of a metal layer provided by the first embodiment as mentioned above, a surface of the metal layer 104 adjacent to the base substrate 101 is formed with protruded portions 1040. That is to say, the surface of the metal layer 104 adjacent to the base substrate 101 is a rough surface. Thus, a surface of the conductive structure 107 formed by patterning the metal layer 104 which is closed to the base substrate 101 is also a rough surface. In a case where the light is irradiated on the surface of the conductive structure 107 closed to the base substrate 101, the light is reflected in all directions. Thus, the surface of the conductive structure 107 closed to the base substrate 101 is capable of playing a role of preventing mirror reflection.

For example, the manufacturing method of a functional substrate provided by an example of the present embodiment is capable of manufacturing an array substrate of a liquid crystal display (LCD) or an organic light emitting diode display (OLED), etc.

Figure 11A:
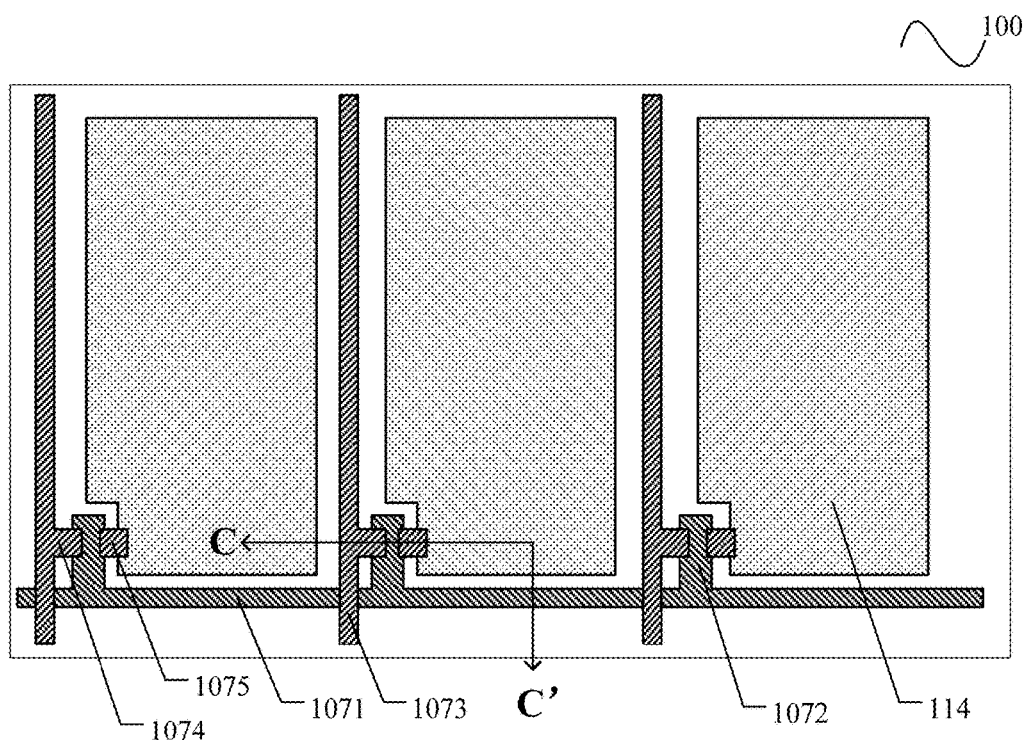
FIG. 11a is a partial planar schematic diagram of another functional substrate provided by an embodiment of the present disclosure.

For example, as illustrated in FIG. 11a, the conductive structure 107 may include a gate line 1071 and a gate electrode 1072; the gate line 1071 may be formed with the gate electrode 1072 by patterning the same metal layer. For example, as illustrated in FIG. 11b, the manufacturing method of a functional substrate provided by the present embodiment may include: forming a gate metal layer on the base substrate 101 according to the manufacturing method of a metal layer provided by the first embodiment, patterning the gate metal layer to form the gate line 1071 and the gate electrode 1072.

For example, as illustrated in FIG. 11a, the conductive structure 107 may include a data line 1073, a source electrode 1074 or a drain electrode 1075. For example, as illustrated in FIG. 11b, the manufacturing method of a functional substrate provided by the present embodiment may include: forming a gate insulating layer 111 on the base substrate 101, the gate line 1071 and the gate electrode 1072; forming an active layer pattern 115 at a position of the gate insulating layer 111 facing to the gate electrode 1072; forming a source drain metal layer on the gate insulating layer 111 and the active layer pattern 115 according to any manufacturing method of a metal layer provided by the first embodiment; patterning the source drain metal layer to form the data line 1073, the source electrode 1074 and the drain electrode 1075, the source electrode 1074 and the drain electrode 1075 are disposed on both sides of the active layer pattern 115.

Figure 11B:
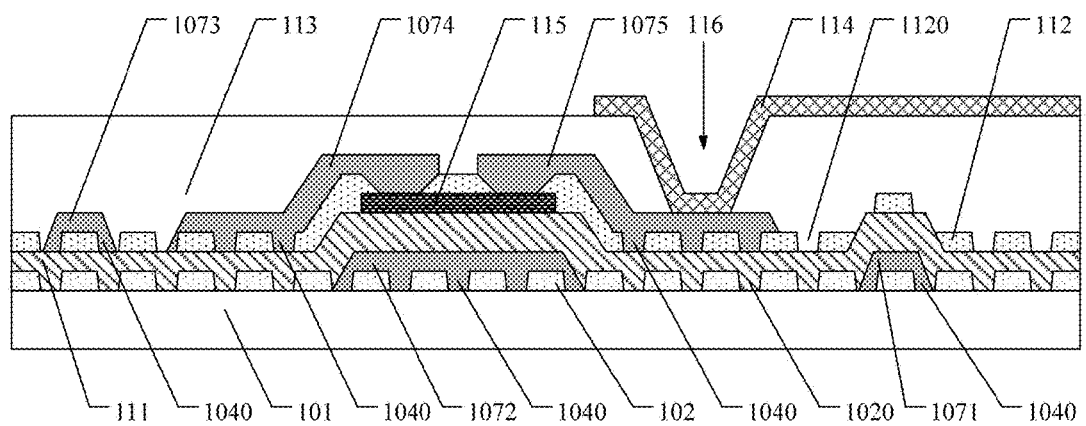
FIG. 11b is a sectional schematic diagram of another functional substrate along the C-C' direction in FIG. 11a provided by an embodiment of the present disclosure.

For example, as illustrated in FIG. 11*b*, the manufacturing method of a functional substrate provided by the present embodiment may further include: forming a planarization layer 113 on the formed substrate as mentioned above; forming a through hole 116 that connected with the drain electrode 1075 on the planarization layer 113; and forming a pixel electrode 114 on the planarization layer 113, the pixel electrode 114 is electrically connected with the drain electrode 1074 through the through hole 116.

Figure 12:
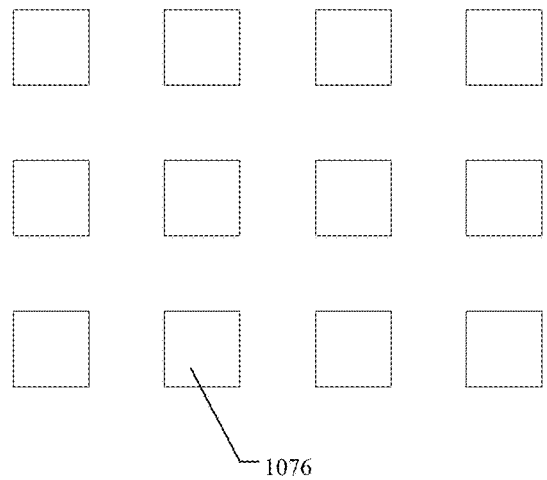
FIG. 12 is a planar schematic diagram of a touch electrode in a functional substrate provided by an embodiment of the present disclosure.

For example, as illustrated in FIG. 12, in order to implement touch function, taking a touch electrode structure of self-capacitance as an example, the conductive structure 107 may include a touch electrode 1076. For example, the manufacturing method of a functional substrate provided by the present embodiment further includes a step of forming the touch electrode 1076. Since the touch control electrode 1076 may also be formed by forming a metal layer before patterning, the specific forming steps are not further described herein. Certainly, the conductive structure 107 may also include a touch electrode of mutual capacitance, which is not limited herein. For example, the touch electrode of mutual capacitance includes a plurality of touch driving electrodes and a plurality of touch sensing electrodes, the plurality of touch driving electrodes may be arranged in parallel in a first direction, the plurality of touch sensing electrodes may be arranged in parallel in a second direction, the first direction is perpendicular to the second direction. The plurality of touch driving electrodes are insulated from the plurality of touch sensing electrodes, for example, an insulating layer is disposed between a layer on which the plurality of touch driving electrodes are located and a layer on which the plurality of touch sensing electrodes are located.

It should be noted that, the present embodiment include but is not limited to manufacture the functional substrate of the above structure, the manufacturing method of a functional substrate provided by the present embodiment may be further configured to manufacture functional substrates of other structures.

In the manufacturing method of a functional substrate provided by the present embodiment, the gate line, the gate electrode, the data line, the source electrode, the drain electrode and the touch electrode have a size of only a few microns to tens of microns generally, however, in a display field, an etching accuracy of etching process is generally about 2 µm. In a case where the microstructures in the insulating layer are etched directly through the etching process, since the etching precision limit, the size of the microstructures relative to the gate line, the gate electrode, the data line, the source electrode, the drain electrode and the touch electrode appears larger. In order to achieve a better effect of surface roughening of the gate line, the gate electrode, the data line, the source electrode, the drain electrode and the touch electrode, it is necessary to form the plurality of recessed microstructures with a smaller size. The etching buffer layer formed on the insulating layer is capable of making the etched channel forming in the etching buffer layer and the insulating layer has a "V" shape or an inverted trapezoid shape through controlling dose of the etching agent or etching time, so as to make the size of plurality of recessed microstructures formed in the insulating layer less than 2 µm. Furthermore, in a case where the manufacturing method of a functional substrate provided by the present embodiment using any manufacturing method of a metal layer provided by the first embodiment, the manufacturing method of a functional substrate has beneficial effects corresponding to the manufacturing method of a metal layer, which is not further repeated herein.

Third Embodiment

The present embodiment provides a functional substrate, as illustrated in FIG. 10, which includes: a base substrate 101, an insulating layer 102 disposed on the base substrate 101 and a conductive structure 107 disposed on the insulating layer 102. The conductive structure 107 includes a metal layer 104, the insulating layer is provided with a plurality of recessed microstructures 1020, and a surface of the metal layer 104 adjacent to the insulating layer 102 is formed with a plurality of protruded portions 1040 which are filled into the plurality of recessed microstructures 1020.

For example, the base substrate 101 may be a glass substrate, a quartz substrate, a resin substrate, or other substrates; the material of the insulating layer 102 may be silicon nitride (SiNx), silicon oxide (SiOX), silicon oxynitride (SiNxOy) or other insulating materials; the metal layer 104 is a single layer of any one or a stacked layer of more selected from a group consisting of chromium, molybdenum, aluminum, copper, aluminum alloy, copper alloy, and the like; the etching buffer layer 103 may include deep ultraviolet light-absorbing oxide (DUO), for example, the etching buffer layer 103 may include organic siloxane polymer.

It should be noted that, the plurality of recessed microstructures may penetrate through the insulating layer 102; or as illustrated in FIG. 4*b*, the plurality of recessed microstructures 1020 do not penetrate through the insulating layer 102, and the plurality of recessed microstructures 1020 are formed on an upper part of the insulating layer 102.

In the functional substrate provided by the present embodiment, the surface of the metal layer 104 adjacent to the insulating layer 102 is formed with a plurality of protruded portions 1040 which are filled into the plurality of recessed microstructures 1020. That is to say, the surface of the metal layer 104 adjacent to the insulating layer 102 is a rough surface; in a case where light is illuminated on the surface of the metal layer 104 adjacent to the insulating layer 102, the light is reflected in all directions; thus, the surface of the metal layer 104 adjacent to the insulating layer 102 is capable of playing an anti-reflective role.

For example, in the functional substrate provided by an example of the present embodiment, the plurality of recessed microstructures may include micropores 1021 or microgrooves 1022, which make the protruded portions 1040 filled into the plurality of recessed microstructures 1020 include slight protrusions or protruded strips so as to reflect collimated light irradiated to the protrusions or protruded strips in different directions.

For example, FIG. 8*a* to 8*d* are planar schematic diagrams of the insulating layer 102 and the plurality of recessed microstructures 1020 formed in the insulating layer 102, as illustrated in FIG. 8a, the plurality of recessed microstructures 1020 in the insulating layer 102 include micropores 1021; as illustrated in FIG. 8b, the plurality of recessed microstructures 1020 in the insulating layer 102 include microgrooves 1022. In order to reflect the light irradiated on the protruded portions 1040 in more different directions, the plurality of recessed microstructures in the insulating layer 102 may disposed to be more complex structures; for example, as illustrated in FIG. 8c, the plurality of recessed microstructures 1020 in the insulating layer 102 may include bent microgrooves 1023; as illustrated in FIG. 8d, the plurality of recessed microstructures 1020 in the insulating layer 102 may include a combination of the micropores 1021 and the microgrooves 1022.

For example, the micropores 1021 as mentioned above may include inverted conical holes, inverted frustum holes or inverted hemispherical holes etc. Correspondingly, the protruded portions 1021 filled into the micropores 1021 as mentioned above may include cones, frustums or hemispheres etc.

For example, in the functional substrate provided by an example of the present embodiment, the plurality of the recessed microstructures are arranged in regular arrangement. It should be noted that, the regular arrangement as mentioned above refers to the plurality of recessed microstructures 1020 are arranged in a certain manner or arranged in a certain pattern period. Certainly, the plurality of recessed microstructures may also be irregularly arranged.

For example, in the functional substrate provided by an example of the present embodiment, the insulating layer 102 may have a thickness of 500-1500 Å. It should be noted that, in a case where the functional substrate provided by the present embodiment is applied to an array substrate of a display device, since the insulating layer has a thinner thickness, the loss of light transmission may be reduced and the aperture ratio is increased.

For example, the functional substrate provided by an example of the present embodiment is applied to an array substrate of a liquid crystal display (LCD) or an organic light emitting diode display (OLED), etc.

For example, as illustrated in FIG. 11a, the conductive structure 107 may include a gate line 1071 and a gate electrode 1072; the gate line 1071 may be formed with the gate electrode 1072 by patterning the same metal layer. For example, the functional substrate provided by the present embodiment may include: a base substrate 101, an insulating layer 102 disposed on the base substrate 101 and a gate line 1071 and a gate electrode 1072 disposed on the insulating layer 102. The insulating layer 102 is provided with a plurality of recessed microstructures 1020, and a surface of the gate line 1071 or the gate electrode 1072 adjacent to the insulating layer 102 is formed with a plurality of protruded portions 1040 which are filled into the plurality of recessed microstructures 1020.

For example, as illustrated in FIG. 11a, the conductive structure 107 may further include a data line 1073, a source electrode 1074 or a drain electrode 1075. For example, as illustrated in FIG. 11b, the functional substrate provided by the present embodiment further includes: a gate insulating layer 111 disposed on the base substrate 101, the gate line 1071 and the gate electrode 1072; an active layer pattern 115 disposed at a position of the gate insulating layer 111 facing to the gate electrode 1072; another insulating layer 112 disposed on the gate insulating layer 111 and the active layer pattern 115; and a data line 1073, a source electrode 1074 and a drain electrode 1075 disposed on the another insulating layer 112, the source electrode 1074 and the drain electrode 1075 are disposed on both sides of the active layer pattern 115. The another insulating layer 112 is provided with the plurality of recessed microstructures 1120, a surface of the data line 1073, a source electrode 1074 or the drain electrode 1075 adjacent to the another insulating layer 112 is formed with the plurality of protruded portions 1040 which are filled into the plurality of recessed microstructures 1020.

For example, as illustrated in FIG. 11b, the functional substrate provided by an example of the present embodiment may further include: a planarization layer 113 disposed on the substrate as mentioned above; a through hole 116 that configured to connect with the drain electrode 1075 is disposed on the planarization layer 113; and a pixel electrode 114 disposed on the planarization layer 113, the pixel electrode 114 is electrically connected with the drain electrode 1074 through the through hole 116.

For example, as illustrated in FIG. 12, in order to implement touch function, taking a touch electrode structure of self-capacitance as an example, the conductive structure 107 may include a touch electrode 1076. Certainly, the conductive structure 107 may also include a touch electrode of mutual capacitance, which is not limited herein.

It should be noted that, the present embodiment includes but is not limited to manufacture the functional substrate of the above structure; the functional substrate provided by the present embodiment may further include manufacture functional substrates of other structures.

Fourth Embodiment

The present embodiment provides a display device, which includes any functional substrate provided by the third embodiment as mentioned above.

It should be noted that, in the display device provided by the present embodiment, since a surface of a conductive structure adjacent to an insulating layer is a rough surface, in a case where light is illuminated on the display device with the functional substrate as mentioned above, the surface of the conductive structure adjacent to the insulating layer is capable of reflecting the light in all directions to avoid generating mirror reflection, the surface of the conductive structure is capable of playing an anti-reflective role, so as to improve display quality.

Figure 13:
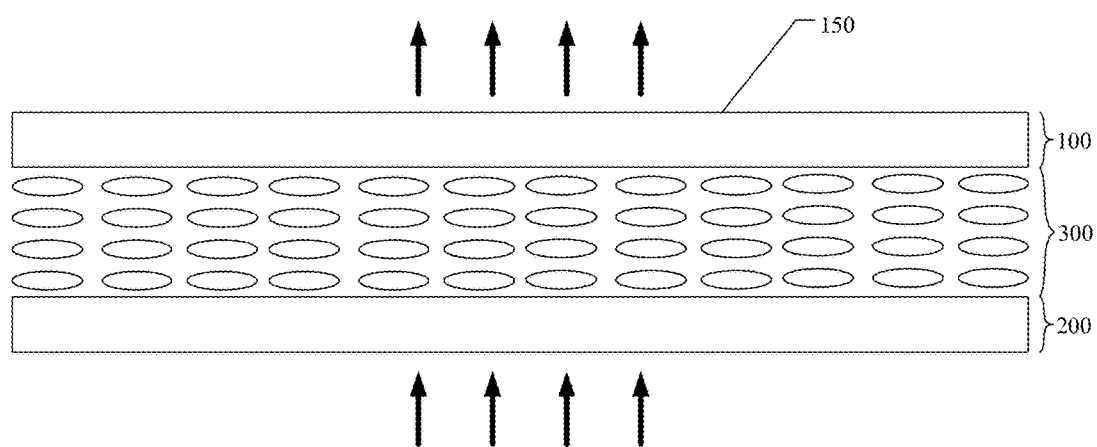
FIG. 13 is a schematic diagram of a display device provided by an embodiment of the present disclosure.

For example, in the display device provided by the present embodiment, as illustrated in FIG. 13, which further includes: a color filter substrate 200, a liquid crystal layer 300; the liquid crystal layer 300 is disposed between the functional layer 100 and the color filter substrate 200. And a surface of the functional substrate 100 facing away from the liquid crystal layer 300 is a light exit surface 150.

It should be noted that, in the display device provided by the present embodiment, since the surface of the functional substrate facing away from the liquid crystal layer is the light exit surface, the light is incident from one side of the color filter substrate and is exited from one side of the functional substrate. Since the functional substrate of the display device faces outwards, there is no additional space for flexible printed circuit boards configured to connect crookedly to the functional substrate, so as to reduce the width of the frame. It should be noted that, in a case where the functional substrate is used to be a light exit side, since the functional substrate with anti-reflective effect, when the external light irradiates the conductive structure in the functional substrate, the surface of the conductive structure adjacent to the insulating layer is capable of reflecting the light in all directions without strong reflection, in order to improve the display quality greatly.

The following points should to be explained:

1) The drawings of at least one embodiment of the present disclosure only relate to the structure in the embodiment of the present disclosure, and other structures may be referenced to the usual design.

2) For clarity purposes, the thickness and size of a layer or microstructure are amplified in the drawings for at least one embodiment of the present disclosure. It should be understood that, when a component such as a layer, a membrane, a region, or a substrate is referred to be located "on" or "down" another element, the component can be located "on" or "down" the another element "directly", or may have an intermediate element.

3) In a case of no conflict, features of the same embodiment or different embodiments of the present disclosure may be combined with each other The above are only specific implementations of the present invention. However the scope of the present invention is not limited thereto. Variations or substitutions that easily occur to any one skilled in the art within the technical scope disclosed in the present invention should be encompassed in the scope of the present invention. Therefore, the scope of the present disclosure should be based on the scope of the claims.

The present application claims priority of China Patent application No. 201610221405.7 filed on Apr. 11, 2016, the content of which is incorporated in its entirety as part of the present application by reference herein.

The invention claimed is:

1. A manufacturing method of a metal layer, comprising:
forming an insulating layer on a base substrate;
forming an etching buffer layer on the insulating layer;
simultaneously patterning the etching buffer layer and the insulating layer to form a plurality of recessed microstructures in the insulating layer;
stripping the etching buffer layer; and
forming a metal layer on the insulating layer, wherein, a surface of the metal layer adjacent to the insulating layer is formed with a plurality of protruded portions which are filled into the plurality of recessed microstructures.

2. The manufacturing method of a metal layer according to claim 1, wherein, forming photoresist on the etching buffer layer; utilizing a mask plate to expose the photoresist and developing the photoresist to form a photoresist pattern; and etching the etching buffer layer and the insulating layer with the photoresist pattern as a mask, so as to pattern the etching buffer layer and the insulating layer to form the plurality of recessed microstructures in the insulating layer.

3. The manufacturing method of a metal layer according to claim 2, wherein, in a process of etching the etching buffer layer and the insulating layer with the photoresist pattern as a mask, an etching rate of the etching buffer layer is greater than or equal to an etching rate of the insulating layer.

4. The manufacturing method of a metal layer according to claim 1, wherein, the plurality of recessed microstructures comprise micropores or microgrooves.

5. The manufacturing method of a metal layer according to claim 4, wherein, the micropores comprise inverted conical holes, inverted frustum holes or inverted hemispherical holes.

6. The manufacturing method of a metal layer according to claim 1, wherein, the plurality of recessed microstructures are arranged in regular arrangement.

7. The manufacturing method of a metal layer according to claim 1, wherein, the etching buffer layer comprises deep ultraviolet light-absorbing oxide.

8. The manufacturing method of a metal layer according to claim 1, wherein, the insulating layer has a thickness of 500-1500 Å.

9. The manufacturing method of a metal layer according to claim 1, wherein, the plurality of recessed microstructures penetrate or do not penetrate the insulating layer.

10. A manufacturing method of a functional substrate, comprising:
forming a metal layer on a base substrate; and
patterning the metal layer to form a conductive structure, wherein, the metal layer is formed by the manufacturing method of a metal layer according to claim 1.

11. The manufacturing method of a functional substrate according to claim 10, wherein, the conductive structure comprises a gate line, a gate electrode, a data line, a source electrode, a drain electrode or a touch electrode.

12. A functional substrate, comprising:
a base substrate, an insulating layer disposed on the base substrate and a conductive structure disposed on the insulating layer,
wherein, the conductive structure comprises a metal layer, wherein, the insulating layer is provided with a plurality of recessed microstructures, a surface of the metal layer adjacent to the insulating layer is formed with a plurality of protruded portions which are filled into the plurality of recessed microstructures,
the conductive structure comprises a gate line, a gate electrode, a data line, a source electrode, a drain electrode or a touch electrode.

13. The functional substrate according to claim 12, wherein, the plurality of recessed microstructures comprise micropores or microgrooves.

14. The functional substrate according to claim 13, wherein, the micropores comprise inverted conical holes, inverted frustum holes or inverted hemispherical holes.

15. The functional substrate according to claim 12, wherein, the plurality of recessed microstructures are arranged in regular arrangement.

16. The functional substrate according to claim 12, wherein, the insulating layer has a thickness of 500-1500 Å.

17. The functional substrate according to claim 12, wherein, the plurality of recessed microstructures penetrate or do not penetrate the insulating layer.

18. A display device, comprising the functional substrate according to claim 12.

19. The display device according to claim 18, further comprising: a color filter substrate and a liquid crystal layer, wherein, the liquid crystal layer is disposed between the functional substrate and the color filter substrate, a surface of the functional substrate facing away from the liquid crystal layer is a light exit surface of the display device.

20. A display device, comprising:
a functional substrate, wherein the functional substrate comprises: a base substrate, an insulating layer disposed on the base substrate and a conductive structure disposed on the insulating layer, the conductive structure comprises a metal layer, the insulating layer is provided with a plurality of recessed microstructures, a surface of the metal layer adjacent to the insulating layer is formed with a plurality of protruded portions which are filled into the plurality of recessed microstructures;
a color filter substrate; and
a liquid crystal layer, wherein, the liquid crystal layer is disposed between the functional substrate and the color filter substrate, a surface of the functional substrate facing away from the liquid crystal layer is a light exit surface of the display device.

* * * * *